(12) United States Patent
Chae et al.

(10) Patent No.: US 8,308,963 B2
(45) Date of Patent: Nov. 13, 2012

(54) ETCHANT FOR ETCHING METAL WIRING LAYERS AND METHOD FOR FORMING THIN FILM TRANSISTOR BY USING THE SAME

(75) Inventors: Gee Sung Chae, Incheon-Kwangyokshi (KR); Gyoo Chul Jo, Kyonggi-do (KR); Yong Sup Hwang, Kyonggi-do (KR)

(73) Assignee: LG Display Co., Ltd., Seoul (KR)

( * ) Notice: Subject to any disclaimer, the term of this patent is extended or adjusted under 35 U.S.C. 154(b) by 158 days.

(21) Appl. No.: 12/839,978

(22) Filed: Jul. 20, 2010

(65) Prior Publication Data

US 2010/0285640 A1 Nov. 11, 2010

Related U.S. Application Data

(62) Division of application No. 11/318,506, filed on Dec. 28, 2005, which is a division of application No. 10/293,565, filed on Nov. 14, 2002, now Pat. No. 7,008,548.

(30) Foreign Application Priority Data

Dec. 6, 2001 (KR) .......................... 10-2001-077119

(51) Int. Cl.
*H01B 13/00* (2006.01)
(52) U.S. Cl. ............ 216/17; 216/18; 216/104; 216/107; 216/108; 438/754
(58) Field of Classification Search .................... 216/17, 216/18, 104, 107, 108; 438/754
See application file for complete search history.

(56) References Cited

U.S. PATENT DOCUMENTS

| 4,140,772 | A | 2/1979 | Korenowski |
| 4,345,969 | A | 8/1982 | James et al. |
| 4,462,861 | A | 7/1984 | McClean |
| 5,298,117 | A | 3/1994 | Hanson et al. |
| 5,551,994 | A | 9/1996 | Schriever |
| 5,773,359 | A | 6/1998 | Mitchell et al. |
| 5,954,997 | A | 9/1999 | Kaufman et al. |
| 5,976,988 | A * | 11/1999 | Konuma et al. ............... 438/745 |
| 5,993,686 | A | 11/1999 | Streinz |
| 6,097,453 | A * | 8/2000 | Okita ............................. 349/43 |
| 6,136,711 | A | 10/2000 | Grumbine et al. |
| 6,172,243 | B1 | 1/2001 | Kuroda et al. |
| 6,262,013 | B1 | 7/2001 | Smith et al. |
| 6,309,560 | B1 | 10/2001 | Kaufman et al. |
| 6,448,612 | B1 * | 9/2002 | Miyazaki et al. ............. 257/344 |
| 6,620,660 | B2 * | 9/2003 | Ohtani et al. ................. 438/158 |

(Continued)

FOREIGN PATENT DOCUMENTS

JP 07155373 A 6/1995

*Primary Examiner* — Binh X Tran
(74) *Attorney, Agent, or Firm* — McKenna Long & Aldridge, LLP

(57) ABSTRACT

The present invention discloses an etchant for etching at least two different metal layers, the etchant comprising hydrogen peroxide ($H_2O_2$) and one of carboxylic acid, carboxylate salt, and acetyl group ($CH_3CO$—). The present invention also discloses a method of fabricating a metal wiring on a substrate, the method comprising forming a first metal layer on a substrate, forming a second metal layer on the first metal layer, and simultaneously etching the first metal layer and the second metal layer with an etchant comprising hydrogen peroxide ($H_2O_2$) and one of carboxylic acid, carboxylate salt, and acetyl group ($CH_3CO$—).

18 Claims, 6 Drawing Sheets

U.S. PATENT DOCUMENTS

| | | |
|---|---|---|
| 6,624,086 B1 | 9/2003 | Eissa |
| 6,861,670 B1 * | 3/2005 | Ohtani et al. .................. 257/66 |
| 2001/0034139 A1 | 10/2001 | Song et al. |
| 2002/0058362 A1 * | 5/2002 | Ohtani et al. ................ 438/151 |
| 2002/0068421 A1 * | 6/2002 | Yamazaki et al. ............ 438/486 |
| 2003/0073386 A1 | 4/2003 | Ma et al. |
| 2003/0102457 A1 | 6/2003 | Miller |
| 2004/0262569 A1 | 12/2004 | Cho et al. |

* cited by examiner

ETCHANT FOR ETCHING METAL WIRING LAYERS AND METHOD FOR FORMING THIN FILM TRANSISTOR BY USING THE SAME

CROSS-REFERENCE TO RELATED APPLICATIONS

This application is a Divisional of pending U.S. patent application Ser. No. 11/318,506, filed Dec. 28, 2005 which is a Divisional of prior U.S. application Ser. No. 10/293,565, filed Nov. 14, 2002 now U.S. Pat. No. 7,008,548, which claims the benefit of Korean Application No. P2001-077119, filed on Dec. 6, 2001, which are hereby incorporated by reference for all purposes as if fully set forth herein.

BACKGROUND OF THE INVENTION

1. Field of the Invention

The present invention relates to a method of forming a thin film transistor, and more particularly, to an etchant for etching metal wiring layers and a method for forming a thin film transistor by using the same. Although the present invention is suitable for a wide scope of applications, it is particularly suitable for etching at least two different metal layers at the same time.

2. Discussion of the Related Art

Generally, a liquid crystal display (LCD) displays a picture by controlling light transmittance of liquid crystal cells in accordance with video signals. An active matrix type liquid crystal display, in which a switching device is provided with each liquid crystal cell, among the liquid crystal displays is suitable to display a moving picture. A thin film transistor (TFT) is mainly used as a switching device in the active matrix type liquid crystal display.

On the other hand, TFT's are divided into one of stagger, coplanar, and self-aligned types in accordance with a three-electrode structure. The stagger type is further divided into an inverted stagger type and a normally stagger type. Herein, the inverted stagger type is the most common type.

Being so widely used in many areas, a TFT as a switching device in the liquid crystal display will be discussed in the present invention. Also, only a gate electrode of the inverted stagger type TFT will be described herein, so that a detailed description on a source electrode and a drain electrode will be omitted.

FIGS. 1A to 1C are cross-sectional views illustrating a related art process of forming a gate electrode of a TFT.

Referring to FIG. 1A, a copper (Cu) layer for a first gate metal 12 is deposited onto a substrate 10 with a thickness in the range of about 1500 and 2000 Å. A tantalum (Ta) layer for a second gate metal 14 of a thickness in the range of about 500 and 1000 Å is deposited on the first gate metal 12. Then, the second gate metal 14 is etched by using a pattern to form a second gate pattern 14a, as shown in FIG. 1B.

Subsequently, the first gate metal 12 is etched by using a pattern to form a first gate pattern 12a, as shown in FIG. 1C. Herein, a gate electrode is formed as a bilayer structure, that is, a copper/tantalum (Cu/Ta) layer structure to prevent damage on the gate electrode in a later process. More specifically, a metal having an excellent electric conductivity is used as the first gate pattern 12a, and a metal for preventing ions of the first gate pattern 12a from being diffused at a high temperature in a later process is used as the second gate pattern 14a. In this process, the first gate pattern 12a is etched by wet-etching, and the second gate pattern 14a is etched by dry-etching.

The second gate pattern 14a acts as a diffusion barrier layer. Molybdenum (Mo), which is not easily etched, may be used to prevent the defect caused by a later etching process.

FIG. 2 is a cross-sectional view of a gate electrode of a TFT, wherein molybdenum (Mo) is used as a second gate pattern 16. A first gate pattern 12b of copper (Cu) is formed on a substrate 10, and a second gate pattern 16 is formed on the first gate pattern 12b. Herein, the first and second gate patterns 12b and 16 are processed by a single-step etching process.

The gate electrode of the related art TFT is formed by either a two-step etching process when tantalum (Ta) is used as the diffusion barrier layer, or a single-step etching process when molybdenum (Mo) is used as the diffusion barrier layer. However, it is difficult to have a uniform pattern because their etching ratios are different from that of copper (Cu). As a result, defects occur in the fabrication process.

Also, when copper (Cu) is used as the gate electrode 12 of the related art TFT, the copper (Cu) layer can be easily removed during the etching process, because a single copper (Cu) layer does not have a good adhesion to the TFT substrate 10 when forming the gate electrode 12. Accordingly, a gate wiring defect occurs during the process, thereby resulting in a poor yield.

On the other hand, when copper (Cu) is used as the source electrode and the drain electrode, the copper atom is diffused to an amorphous silicon layer at a temperature higher than about 200° C. and deteriorates the characteristic of a TFT. Consequently, copper (Cu) is hardly used as the source electrode and the drain electrode.

SUMMARY OF THE INVENTION

Accordingly, the present invention is directed to an etchant for etching metal wiring layers and a method for forming a thin film transistor by using the same that substantially obviates one or more of problems due to limitations and disadvantages of the related art.

Another object of the present invention is to provide an etchant for etching metal wiring layers comprising hydrogen peroxide ($H_2O_2$) and one of carboxylic acid, carboxylate salt, and acetyl group ($CH_3CO$—) and a method for forming a thin film transistor by using the same.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an etchant for etching at least two different metal layers includes hydrogen peroxide ($H_2O_2$) and one of carboxylic acid, carboxylate salt, and acetyl group ($CH_3CO$—).

Herein, the etchant further includes fluorine (F).

In the etchant, the fluorine (F) has a concentration of about 0.1 wt % or more.

In the etchant, the carboxylic acid, which an organic acid includes —COOH, includes one of acetic acid ($CH_3COOH$), citric acid ($C_6H_8O_7$), oxalic acid ($C_2H_2O_4$), and tartaric acid ($C_4H_6O_6$). The carboxylate salt includes one of ammonium acetate ($CH_3COONH_4$), sodium acetate ($CH_3COONa$), and potassium acetate ($CH_3COOK$). And, the acetyl group ($CH_3CO$—) includes one of pivalic acid (($CH_3)_3C_2OOH$), ammonium pivalate (($CH_3$)$_3C_2OONH_4$), sodium pivalate (($CH_3$)$_3C_2OONa$), and potassium pivalate (($CH_3$)$_3C_2OOK$).

In the etchant, at least one of the carboxylic acid and the carboxylate salt has a concentration of about 0.5 wt % or more, and the hydrogen peroxide ($H_2O_2$) has a concentration of about 0.1 mol or more.

In the etchant, the at least two different metal layers include copper/titanium (Cu/Ti).

In the etchant, the at least two different metal layers include titanium/copper/titanium (Ti/Cu/Ti).

In another aspect of the present invention, a method of fabricating a metal wiring on a substrate includes forming a first metal layer on a substrate, forming a second metal layer on the first metal layer, simultaneously etching the first metal layer and the second metal layer with an etchant comprising hydrogen peroxide ($H_2O_2$) and one of carboxylic acid, carboxylate salt, and acetyl group ($CH_3CO—$).

In the method, the carboxylate acid, which an organic acid includes —COOH, includes one of acetic acid ($CH_3COOH$), citric acid ($C_6H_8O_7$), oxalic acid ($C_2H_2O_4$), and tartaric acid ($C_4H_6O_6$). The carboxylate salt includes one of ammonium acetate ($CH_3COONH_4$), sodium acetate ($CH_3COONa$), and potassium acetate ($CH_3COOK$). And, the acetyl group ($CH_3CO—$) includes one of pivalic acid (($CH_3$)$_3C_2OOH$), ammonium pivalate (($CH_3$)$_3C_2OONH_4$) sodium pivalate (($CH_3$)$_3C_2OONa$), and potassium pivalate (($CH_3$)$_3C_2OOK$).

In the method, at least one of the carboxylic acid and the carboxylate salt has a concentration of about 0.5 wt % or more, and the hydrogen peroxide ($H_2O_2$) has a concentration of about 0.1 mol or more.

Herein, the etchant further includes fluorine (F).

The first metal layer is titanium (Ti), and the second metal layer is copper (Cu).

In a further aspect of the present invention, a method of forming a thin film transistor includes forming a first metal layer including at least two different metal layers on a substrate, forming a gate electrode and a gate line by etching with an etchant comprising hydrogen peroxide ($H_2O_2$) and one of carboxylic acid, carboxylate salt, and acetyl group ($CH_3CO—$), forming a gate insulation layer on the substrate to cover the gate electrode and the gate line, sequentially forming an active layer and an ohmic contact layer on the gate insulation layer, forming a second metal layer including at least two different metal layers on the substrate, etching the second metal layer to form a source electrode and a drain electrode, forming a protective layer to cover the source electrode and the drain electrode on the gate insulation layer with a contact hole for exposing the drain electrode, and forming a pixel electrode connected to the drain electrode through the contact hole.

In the method, the etchant further includes fluorine (F).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1A:
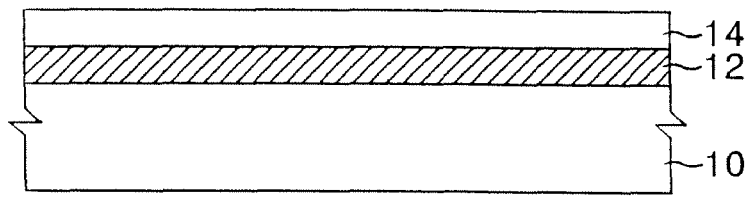
FIGS. 1A to 1C are cross-sectional views illustrating a process of forming a gate electrode of a related art TFT.
Figure 1B:
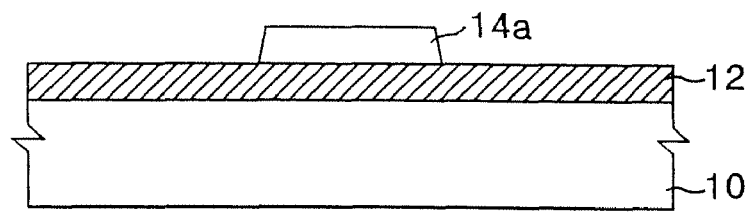
Figure 1C:
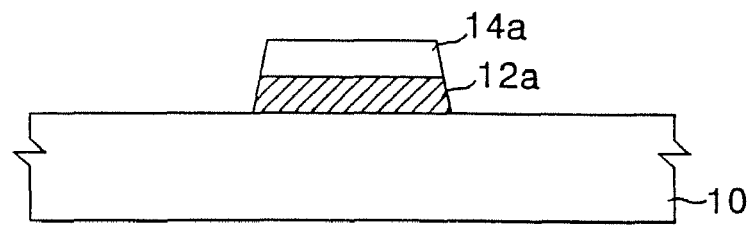
Figure 2:
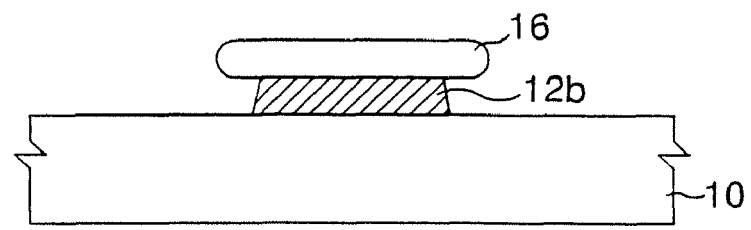
FIG. 2 is a cross-sectional view illustrating another process of forming a gate electrode of a related art TFT.
Figure 3A:
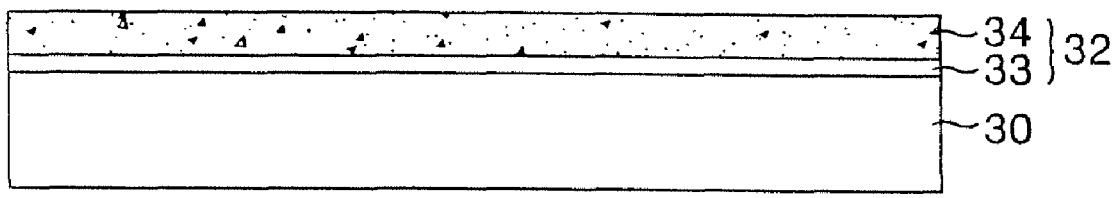
FIGS. 3A to 3E are cross-sectional views illustrating a method of forming a thin film transistor according to the present invention.

Referring to FIG. 3A, on a substrate 30 according to the present invention, a first metal layer 33 and a second metal layer 34, which will be a gate electrode 32, are sequentially deposited by sputtering. A titanium (Ti) layer may be selected for the first metal layer 33, whereas a copper (Cu) layer having a good conductivity may be chosen for the second metal layer 34. Herein, titanium (Ti) improves an adhesion between the copper (Cu) layer and the substrate 30. Meanwhile, the gate electrode 32 may be formed with triple metal layers (not shown) of a titanium/copper/titanium (Ti/Cu/Ti) structure.

Figure 3B:
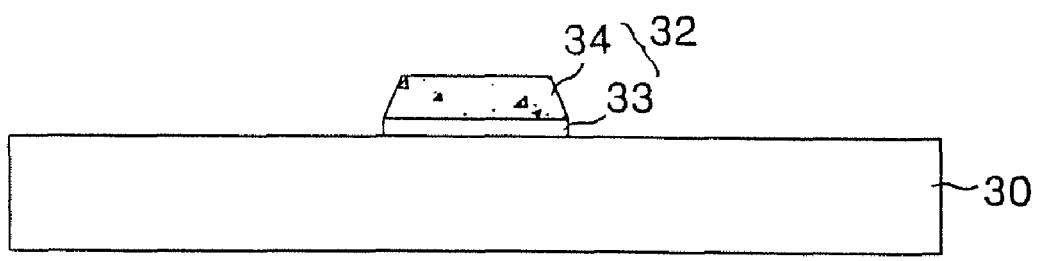

Referring to FIG. 3B, the first metal layer 33 and the second metal layer 34 are patterned by photolithography and wet-etching to form the gate electrode 32 on the substrate 30.

More specifically, the gate electrode 32 formed of the first metal layer 33 of titanium (Ti) and the second metal layer 34 of copper (Cu) is etched with an etchant including hydrogen peroxide ($H_2O_2$), fluoric ion (F-Ion), and one of carboxylic acid, carboxylate salt, and acetyl group ($CH_3CO—$).

In the wet-etching using the etchant according to the present invention, one of dipping and spraying is used in a bath (not shown).

More specifically, the copper (Cu) layer of the second metal layer for the gate electrode 32 formed on the substrate 30 is etched with an etchant including hydrogen peroxide ($H_2O_2$) and one of carboxylic acid, carboxylate salt, and acetyl group ($CH_3CO—$) by a chemical reaction as in the following chemical reactions 1 and 2.

Herein, the carboxylic acid, which an organic acid includes —COOH, may be one of acetic acid ($CH_3COOH$), citric acid ($C_6H_8O_7$), oxalic acid ($C_2H_2O_4$), and tartaric acid ($C_4H_6O_6$). The carboxylate salt may be one of ammonium acetate ($CH_3COONH_4$), sodium acetate ($CH_3COONa$), and potassium acetate (CH$_3$COOK). The acetyl group (CH$_3$CO—) may be one of pivalic acid ((CH$_3$)$_3$C$_2$OOH), ammonium pivalate ((CH$_3$)$_3$C$_2$OONH$_4$), sodium pivalate ((CH$_3$)$_3$C$_2$OONa), and potassium pivalate ((CH$_3$)$_3$C$_2$OOK).

Cu+H$_2$O$_2$=CuO+H$_2$O  [Chemical Reaction 1]

2Cu+H$_2$O$_2$=Cu$_2$O+H$_2$O  [Chemical Reaction 2]

In an etching mechanism of the copper (Cu) layer according to the chemical reactions 1 and 2, a reaction occurs between copper (Cu) and oxygen (O) contained in the hydrogen peroxide (H$_2$O$_2$) to separate oxidized copper (CuO) and water (H$_2$O) from the reactions. Subsequently, the oxidized copper (CuO) formed by the reaction between the copper (Cu) and the hydrogen peroxide (H$_2$O$_2$) reacts with one of carboxylic acid, carboxylate salt, and acetyl group (CH$_3$CO—), thereby forming copper acetate (Cu(CH$_3$COO)$_2$) in being etched.

Likewise, after the etching of the copper (Cu) layer, which is the second metal layer 34 of the gate electrode 32, the first metal layer 33 of titanium (Ti) layer is etched. The titanium (Ti) layer is etched with fluoride having fluoric ion (F-Ion), which is contained in the etchant, by a chemical reaction, as shown in the following chemical reaction 3.

Ti+4HF=TiF$_4$  [Chemical Reaction 3]

In an etching mechanism of the titanium (Ti) layer according to the chemical reaction 3, titanium (Ti) easily reacts with fluoric ion (F-Ion) and forms titanium fluoride (TiF$_4$) in being etched. Herein, when about 0.1 wt % or more fluoric ion (F-Ion) is contained in the etchant, and one of hydrogenfluoric acid (HF), ammonium fluoride (NH$_4$F), potassium fluoride (KF), sodium fluoride (NaF), and potassium bifluoride (KHF$_2$) is used to form an aqueous solution, the ions are easily dissociated in forming the solution.

Figure 3C:
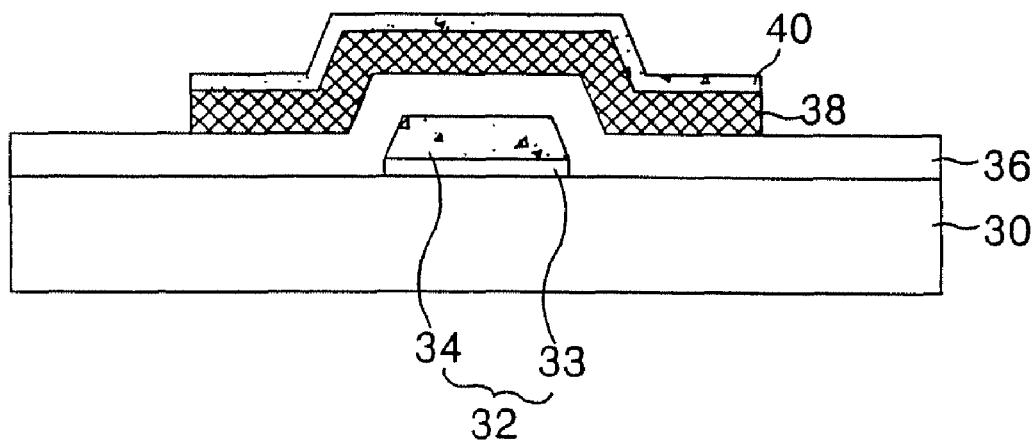

Similarly, a gate insulation layer 36, an active layer 38 and an ohmic contact layer 40 are deposited thereon, as illustrated in FIG. 3C, on the TFT substrate 30 where the gate electrode 32 is formed by using an etchant including hydrogen peroxide (H$_2$O$_2$), fluoric ion (F-Ion), and one of carboxylic acid, carboxylate salt, and acetyl group (CH$_3$CO—).

Referring to FIG. 3C, the gate insulation layer 36 is formed by depositing an insulation material of silicon nitride or silicon oxide onto the entire surface of the substrate 30. An amorphous silicon layer and an amorphous silicon layer doped with highly concentrated impurities are sequentially deposited on the gate insulation layer 36 by using chemical vapor deposition (CVD). The amorphous silicon layer and the amorphous silicon layer doped with the impurities are etched to be the active layer 38 and the ohmic contact layer 40 by photolithography, respectively.

Figure 3D:
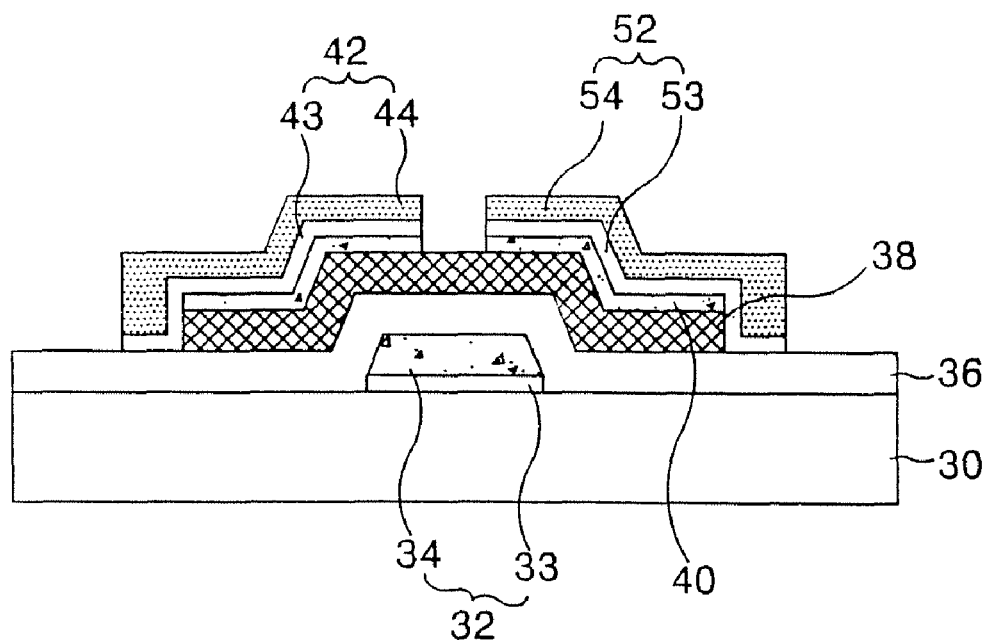

Referring to FIG. 3D, source and drain electrodes 42 and 52 are formed on the gate insulation layer 36 to cover the ohmic contact layer 40. The source and drain electrodes 42 and 52 consist of the first metal layers 43 and 53 and the second metal layers 44 and 54, respectively. Alternatively, the source and drain electrodes 42 and 52 may be formed with triple metal layers (not shown) of a titanium/copper/titanium (Ti/Cu/Ti) structure.

The source and drain electrodes 42 and 52 are formed by photolithography after depositing the first metal layers 43 and 53 and the second metal layers 44 and 54 on the gate insulation layer 36 by using CVD or sputtering to cover the ohmic contact layer 40.

Then, the source and drain electrodes 42 and 52 formed with the first metal layers 43 and 53 of copper (Cu) and the second metal layers 44 and 54 of titanium (Ti) are simultaneously formed by using the same method as the gate electrode 32. More specifically, the source and drain electrodes 42 and 52 are etched by using an etchant including hydrogen peroxide (H$_2$O$_2$), fluoric ion (F-Ion), and one of carboxylic acid, carboxylate salt, and acetyl group (CH$_3$CO—).

The ohmic contact layer 40 exposed by using a mask is dry-etched to expose the active layer 38 between the source and drain electrodes 42 and 52. An area corresponding to the gate electrode 32 between the source and drain electrodes 42 and 52 of the active layer 38 becomes a channel.

Figure 3E:
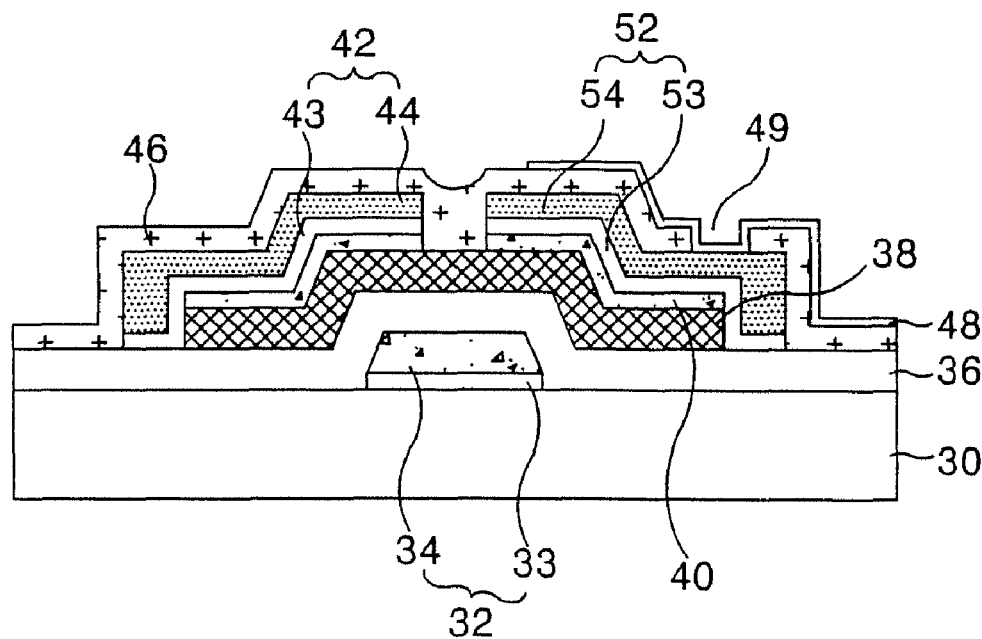

Referring to FIG. 3E, a protective layer 46 is formed by depositing an insulation material on the entire surface of the substrate 30. In this case, a contact hole 49 exposing a portion of the drain electrode 52 is formed therein.

The protective layer 46 is formed of either an inorganic insulation material, such as silicon nitride and silicon oxide, or an organic insulation material having a small dielectric constant, such as a acrylic organic compound, Teflon (Polytetrafluoroethylene (PTFE)), benzocyclobutene (BCB), Cytop (fluoropolymer), and perflurocyclobutane (PFCB).

A pixel electrode 48 is formed on the protective layer 46. A transparent conductive material, such as ITO, IZO, and ITZO, is deposited to form the pixel electrode 48. The pixel electrode 48 is electrically in contact with the drain electrode 52 through the contact hole 49.

As described above, a TFT is formed by sequentially depositing the gate electrode 32, the gate insulation layer 36, the active layer 38, the ohmic contact layer 40, and the source and drain electrodes 42 and 52 on the substrate 30. The gate electrode 32 is connected to a gate line (not shown) and the source electrode 42 is connected to a data line (not shown). The drain electrode 52 is in contact with the pixel electrode 48 through the contact hole 49 formed on the protective layer 46.

Figure 4:
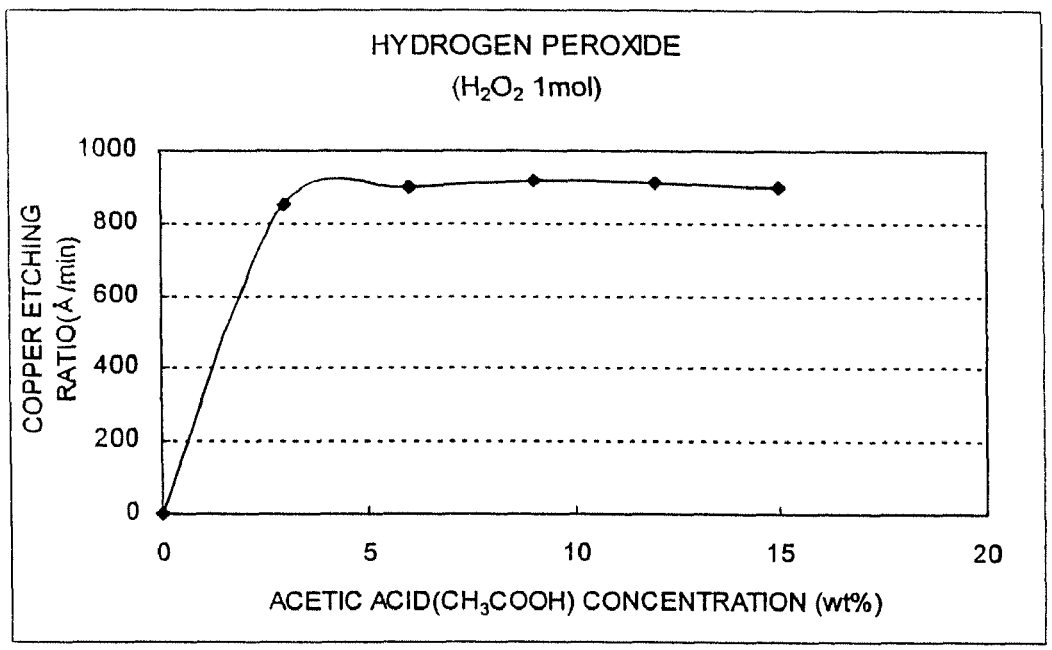
FIG. 4 is a graph illustrating variations in an etching, rate of copper (Cu) with different concentrations of acetic acid contained in an etchant according to the present invention.

FIG. 4 is a graph illustrating variations in an etching rate of copper (Cu) with different concentrations of acetic acid (CH$_3$COOH) contained in an etchant according to the present invention.

Referring to FIG. 4, the Y-axis represents an etching rate (Å/mm) of copper (Cu), and the X-axis represents a concentration of acetic acid (CH$_3$COOH). Also, a concentration of hydrogen peroxide (H$_2$O$_2$) contained in the etchant is set to be about 1 mol, and an etching temperature is about 25° C.

The copper (Cu) layer cannot be etched when the concentration of one of carboxylic acid, carboxylate salt, and acetyl group (CH$_3$CO—) contained in the etchant is about 0 wt %. However, the copper (Cu) layer is etched when the concentration of one of carboxylic acid, carboxylate salt, and acetyl group (CH$_3$CO—) contained in the etchant is about 0.5 wt % or more. In the process, when one of carboxylic acid, carboxylate salt, and acetyl group (CH$_3$CO—) is contained in the etchant with the concentration of about 3 wt % or more, the etching rate is not changed with a higher concentration.

Figure 5:
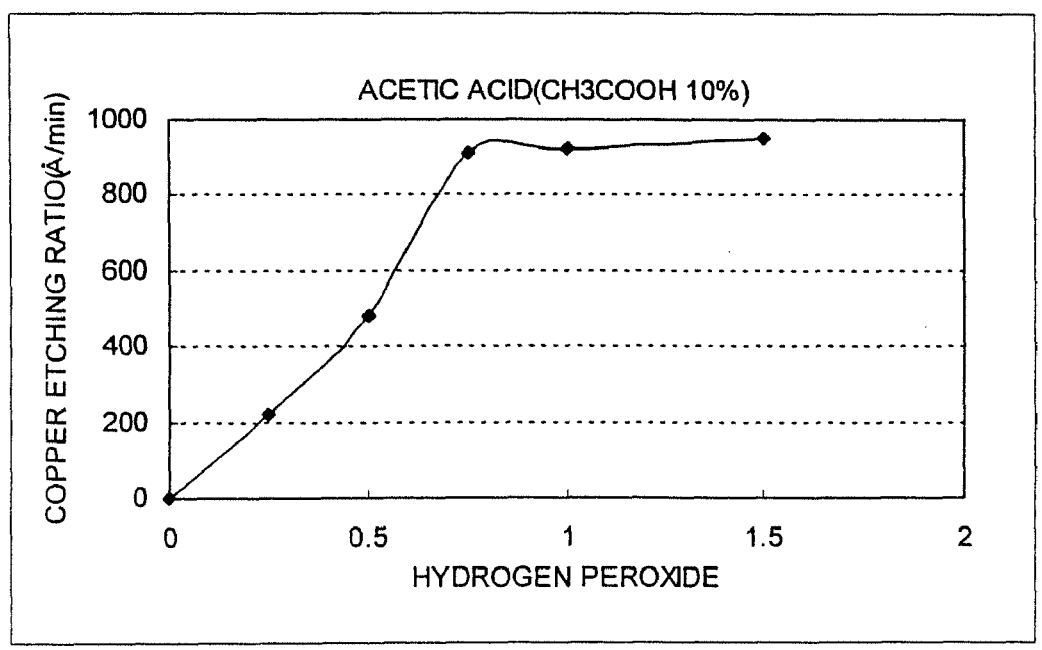
FIG. 5 is a graph illustrating variations in the etching rate of copper (Cu) with different concentrations of hydrogen peroxide contained in an etchant according to the present invention.

FIG. 5 is a graph illustrating variations in the etching rate of copper (Cu) with different concentrations of hydrogen peroxide (H$_2$O$_2$) contained in an etchant according to the present invention.

Referring to FIG. 5, the Y-axis represents the etching rate (Å/mm) of copper (Cu), and the X-axis represents a concentration of hydrogen peroxide (H$_2$O$_2$). Also, a concentration of acetic acid (CH$_3$COOH) contained in the etchant is set to be about 10%, and an etching temperature is about 25° C.

The copper (Cu) layer cannot be etched when the concentration of hydrogen peroxide (H$_2$O$_2$) contained in the etchant is about 0 mol. However, the copper (Cu) layer is etched when the concentration of hydrogen peroxide (H$_2$O$_2$) contained in the etchant is about 0.1 mol or more. In this process, when the concentration of hydrogen peroxide (H$_2$O$_2$) contained in the etchant is low enough (e.g., about 0.6 mol or less), the etching rate increases slowly. When the concentration is high enough (e.g., about 0.6 mol or more), the etching rate is not changed regardless of the concentration.

The concentration of hydrogen peroxide ($H_2O_2$) and one of carboxylic acid, carboxylate salt, and acetyl group ($CH_3CO$—) contained in the etchant may be changed in accordance with a thickness of copper (Cu).

Figure 6:
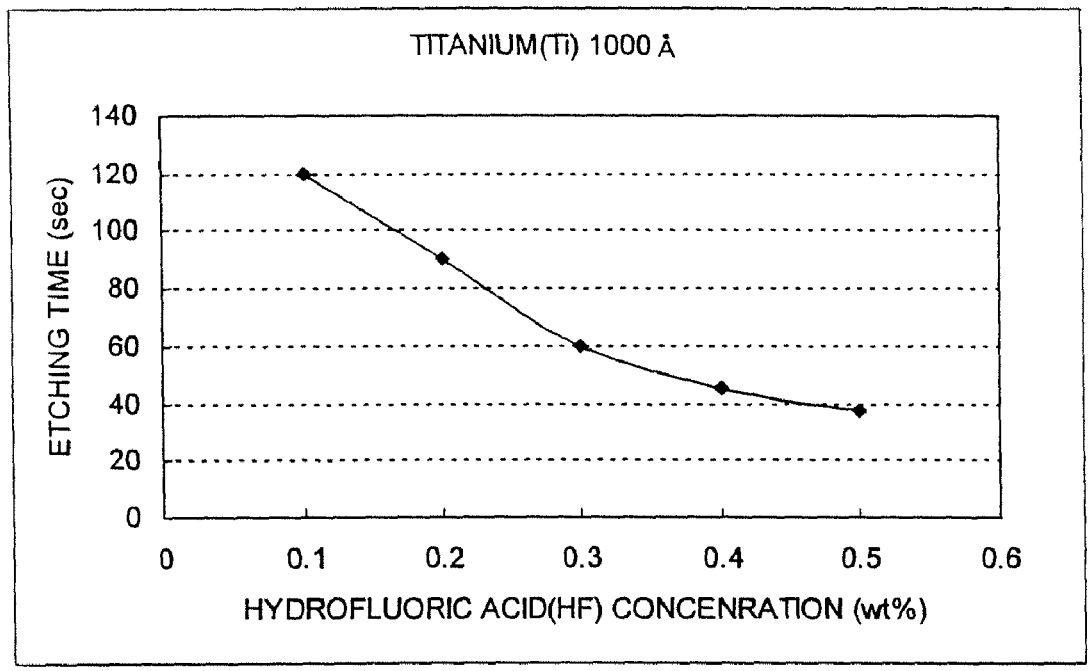
FIG. 6 is a graph illustrating variations in an etching rate of titanium (Ti) with different concentrations of a hydrofluoric acid contained in an etchant according to the present invention.

FIG. 6 is a graph illustrating variations in an etching rate of titanium (Ti) with different concentrations of a hydrofluoric acid contained in an etchant according to the present invention.

Referring to FIG. 6, the Y-axis represents an etching time (sec.) of titanium (Ti), and the X-axis represents a concentration of hydrofluoric acid (HF). Also, a thickness of the titanium (Ti) is set to be about 10001, and an etching temperature is about 25° C.

An etching time of titanium (Ti) decreases at a constant rate while a concentration of hydrofluoric acid (HF) increases. Accordingly; the concentration of hydrofluoric acid (HF) contained in the etchant is determined in accordance with a thickness of the titanium (Ti) layer.

Figure 7:
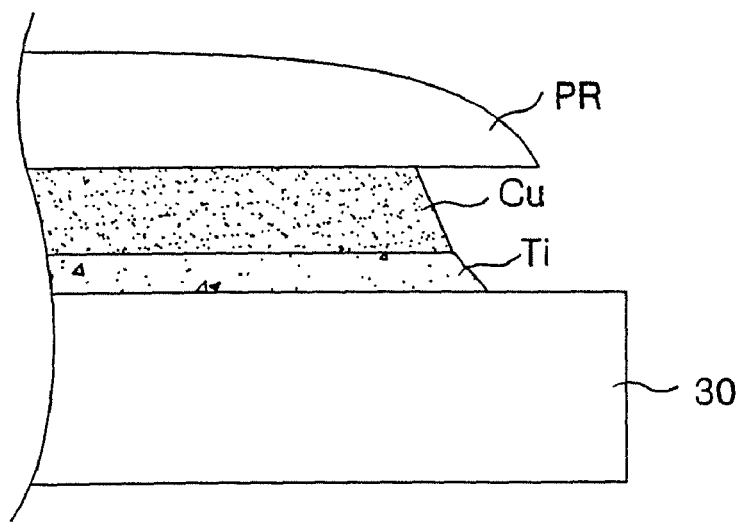
FIG. 7 is a cross-sectional view illustrating an electrode etched by an etchant according to the present invention.

FIG. 7 is a cross-sectional view of a gate electrode 32 formed by etching with an etchant, which contains hydrogen peroxide ($H_2O_2$) of about 1 mol, acetic acid ($CH_3COOH$) of about 10%, and fluoric ion (F-Ion) of about 0.3%, according to the present invention.

Figure 8:
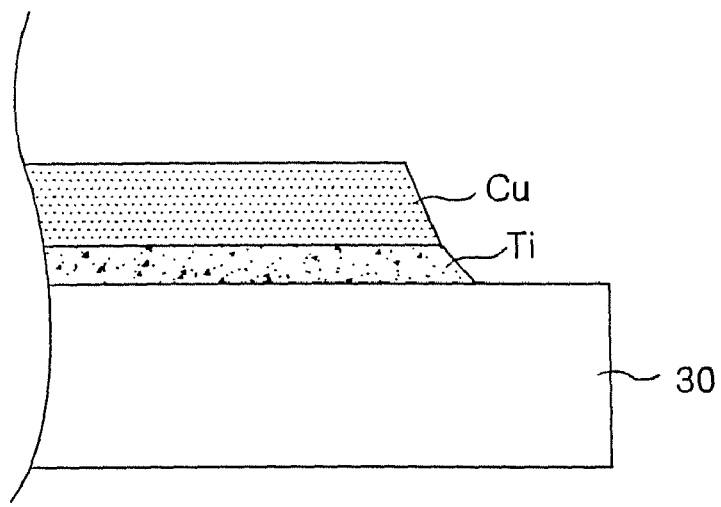
FIG. 8 is a cross-sectional view of an electrode etched by an etchant according to the present invention.
Figure 9:
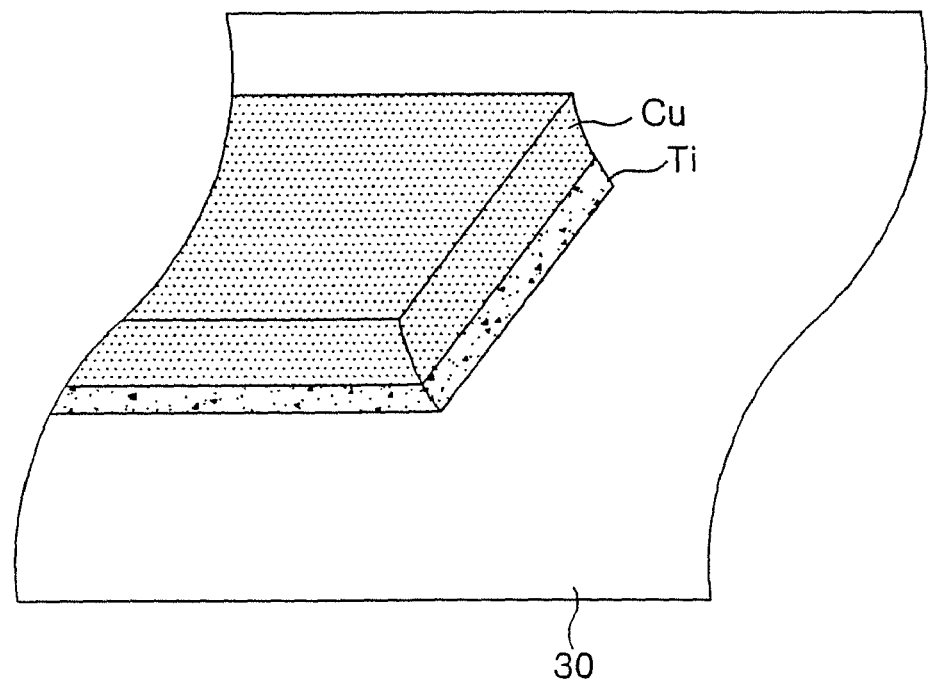
FIG. 9 is a perspective view of an electrode etched by an etchant according to the present invention.

FIGS. 8 and 9 are a cross-sectional view and a plane view of the gate electrode of FIG. 7.

Referring to FIGS. 7 to 9, the gate electrode 32 is etched with an etching time of about 80 sec., an etching temperature of about 25° C., and by using a spraying method. The etchant includes a substance for etching a copper (Cu) layer and a substance for etching a titanium (Ti) layer. More specifically, the copper (Cu) etchant includes hydrogen peroxide ($H_2O_2$) of about 0.1 mol or more and the acetic acid ($CH_3COOH$) of about 0.5 wt % or more to etch the copper (Cu) layer of about 2000 Å, and the titanium (Ti) etchant includes fluoric ion (F-Ion) of about 0.3% or more to etch the titanium (Ti) layer of about 200 Å.

In this way, the etchant for etching the metal layer, where the copper (Cu) layer and the titanium (Ti) layer for forming the gate electrode 32 of the TFT, can have different concentrations of hydrogen peroxide ($H_2O_2$), fluoric ion (F-Ion), and one of carboxylic acid, carboxylate salt, and acetyl group ($CH_3CO$—) in accordance with the thickness of the copper (Cu) layer and the titanium (Ti) layer.

For example, a concentration of acetyl group ($CH_3CO$—) should be about 0.5 wt % or more, a concentration of hydrogen peroxide ($H_2O_2$) should be about 0.1 mol or more, a concentration of fluoride ion (F-Ion) should be about 0.1 wt % or more in the etchant containing hydrogen peroxide ($H_2O_2$), fluoric ion (F-Ion), and one of carboxylic acid, carboxylate salt, and acetyl group ($CH_3CO$—).

As described above, according to the present invention, the gate electrode, the source electrode, and the drain electrode of the transistor of the titanium (Ti) layer and the copper (Cu) layer are etched at the same time using the etchant containing hydrogen peroxide ($H_2O_2$), fluoric ion (F-Ion), and one of carboxylic acid, carboxylate salt, and acetyl group ($CH_3CO$—) to improve an adhesion of the copper (Cu) layer to the substrate, and thereby preventing the copper (Cu) layer from being peeled off from the substrate. Also, since copper (Cu) having a low resistance is used as an electrode material, a width of the electrode can be reduced. As a result, a panel with high precision is fabricated in accordance with the present invention.

Also, the etchant according to the present invention is used to process a wiring Material for the electronic equipment such as a semiconductor device having titanium (Ti) and copper (Cu) layers.

It will be apparent to those skilled in the art that various modifications and variations can be made in the etchant for etching metal wiring layers and the method for forming a thin film transistor by using the same of the present invention without departing from the spirit or scope of the inventions. Thus, it is intended that the present invention covers the modifications and variations of this invention provided they come within the scope of the appended claims and their equivalents.

What is claimed is:

1. A method of fabricating a thin film transistor, comprising:
    forming first metal layers including at least two different metal layers on a substrate;
    forming a gate electrode and a gate line by etching with an etchant comprising hydrogen peroxide ($H_2O_2$) and one of carboxylic acid, carboxylate salt, and acetyl group ($CH_3CO$—);
    forming a gate insulation layer on the substrate to cover the gate electrode and the gate line;
    sequentially forming an active layer and an ohmic contact layer on the gate insulation layer;
    forming second metal layers including the at least two different metal layers on the substrate;
    etching the second metal layers to form a source electrode and a drain electrode;
    forming a protective layer to cover the source electrode and the drain electrode on the gate insulation layer with a contact hole for exposing the drain electrode; and
    forming a pixel electrode connected to the drain electrode through the contact hole.

2. The method according to claim 1, wherein a concentration of one of carboxylic acid, carboxylate salt, and acetyl group ($CH_3CO$—) is substantially in the range of 0.5 wt % to 3 wt %.

3. The method according to claim 1, wherein a concentration of hydrogen peroxide ($H_2O_2$) is substantially 0.1 mol or more.

4. The method according to claim 1, wherein a concentration of one of carboxylic acid, carboxylate salt, and acetyl group ($CH_3CO$—) is substantially 0.5 wt % or more and a concentration of hydrogen peroxide ($H_2O_2$) is substantially 0.1 mol or more.

5. The method according to claim 1, wherein at least one of the first metal layers and the second metal layers includes a double layered structure having copper (Cu) layer.

6. The method according to claim 1, wherein the pixel electrode is formed on the protective layer.

7. The method according to claim 1, wherein the pixel electrode is formed of one of ITO, IZO, and ITZO.

8. The method according to claim 1, wherein the etching the second metal layers uses an etchant comprising hydrogen peroxide ($H_2O_2$) and one of carboxylic acid, carboxylate salt, and acetyl group ($CH_3CO$—).

9. The method according to claim 1, wherein the carboxylic acid includes —COOH.

10. The method according to claim 1, wherein the first metal layers or the second metal layers include at least copper/titanium (Cu/Ti).

11. The method according to claim 1, wherein the first metal layers or the second metal layers include at least titanium/copper/titanium (Ti/Cu/Ti).

12. The method according to claim 1, wherein the first metal layers or the second metal layers include an upper layer and a lower layer, and the upper layer is thicker than the lower layer.

13. The method according to claim 1, wherein the etchant further comprises fluorine (F).

14. The method according to claim 13, wherein the fluorine (F) includes one of hydrogenfluoric acid (HF), ammonium fluoride ($NH_4F$), potassium fluoride (KF), sodium fluoride (NaF), and potassium bifluoride ($KHF_2$).

15. The method according to claim 1, wherein at least one of the first metal layers and the second metal layers includes a triple layered structure having copper (Cu) layer.

16. The method according to claim 15, wherein the copper (Cu) layer is interposed between a bottom layer and a top layer.

17. The method according to claim 1, wherein the protective layer includes one of an inorganic insulation material and an organic insulation material.

18. The method according to claim 17, wherein the organic insulation material includes one of an acrylic organic compound, benzocyclobytene (BCB), and perfluorocyclobutane (PFCB).

\* \* \* \* \*

(12) EX PARTE REEXAMINATION CERTIFICATE (10483rd)
United States Patent
Chae et al.

(10) Number: US 8,308,963 C1
(45) Certificate Issued: Jan. 27, 2015

(54) ETCHANT FOR ETCHING METAL WIRING LAYERS AND METHOD FOR FORMING THIN FILM TRANSISTOR BY USING THE SAME

(75) Inventors: Gee Sung Chae, Incheon-Kwangyokshi (KR); Gyoo Chul Jo, Kyonggi-do (KR); Yong Sup Hwang, Kyonggi-do (KR)

(73) Assignee: LG Display Co., Ltd., Youngdungpo-Ku, Seoul (KR)

Reexamination Request:
No. 90/013,150, Feb. 11, 2014

Reexamination Certificate for:
Patent No.: 8,308,963
Issued: Nov. 13, 2012
Appl. No.: 12/839,978
Filed: Jul. 20, 2010

Related U.S. Application Data

(62) Division of application No. 11/318,506, filed on Dec. 28, 2005, now Pat. No. 8,257,609, which is a division of application No. 10/293,565, filed on Nov. 14, 2002, now Pat. No. 7,008,548.

(30) Foreign Application Priority Data

Dec. 6, 2001 (KR) .......................... 10-2001-077119

(51) Int. Cl.
*H01B 13/00* (2006.01)
*C23F 1/18* (2006.01)
*H01L 29/66* (2006.01)
*C23F 1/26* (2006.01)
*H01L 21/3213* (2006.01)
*H01L 29/45* (2006.01)
*H01L 29/49* (2006.01)
*G02F 1/1333* (2006.01)

(52) U.S. Cl.
CPC ............ *C23F 1/18* (2013.01); *H01L 29/66765* (2013.01); *C23F 1/26* (2013.01); *H01L 21/32134* (2013.01); *H01L 29/458* (2013.01); *H01L 29/4908* (2013.01); *G02F 1/133351* (2013.01)
USPC ............... 216/17; 216/18; 216/104; 216/107; 216/108; 438/754

(58) Field of Classification Search
None
See application file for complete search history.

(56) References Cited

To view the complete listing of prior art documents cited during the proceeding for Reexamination Control Number 90/013,150, please refer to the USPTO's public Patent Application Information Retrieval (PAIR) system under the Display References tab.

*Primary Examiner* — Timothy J. Kugel

(57) ABSTRACT

The present invention discloses an etchant for etching at least two different metal layers, the etchant comprising hydrogen peroxide ($H_2O_2$) and one of carboxylic acid, carboxylate salt, and acetyl group ($CH_3CO$—). The present invention also discloses a method of fabricating a metal wiring on a substrate, the method comprising forming a first metal layer on a substrate, forming a second metal layer on the first metal layer, and simultaneously etching the first metal layer and the second metal layer with an etchant comprising hydrogen peroxide ($H_2O_2$) and one of carboxylic acid, carboxylate salt, and acetyl group ($CH_3CO$—).

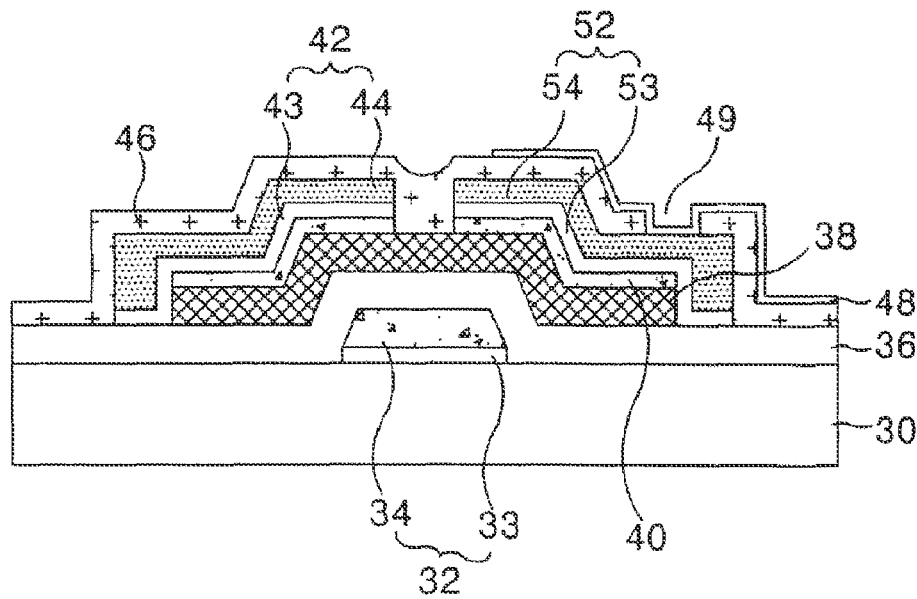

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 10, 13 and 18 are determined to be patentable as amended.

Claims 2-9, 11, 12 and 14-17, dependent on an amended claim, are determined to be patentable.

New claims 19-30 are added and determined to be patentable.

1. A method of fabricating a thin film transistor, comprising:
   forming first metal layers including at least two different metal layers on a substrate;
   [forming a gate electrode and a gate line by] *simultaneously* etching *the first metal layers to form a gate electrode and a gate line* with an etchant comprising hydrogen peroxide ($H_2O_2$) and one of carboxylic acid, carboxylate salt, and acetyl group ($CH_3CO^-$);
   forming a gate insulation layer on the substrate to cover the gate electrode and the gate line
   sequentially forming an active layer and an ohmic contact layer on the gate insulation layer;
   forming second metal layers including the at least two different metal layers on the substrate;
   etching the second metal layers to form a source electrode and a drain electrode;
   forming a protective layer to cover the source electrode and the drain electrode on the gate insulation layer with a contact hole for exposing the drain electrode; and
   forming a pixel electrode connected to the drain electrode through the contact hole.

10. [The method according to claim 1.] *A method of fabricating a thin film transistor, comprising:*
    *forming first metal layers including at least two different metal layers on a substrate;*
    *forming a gate electrode and a gate line by etching with an etchant comprising hydrogen peroxide ($H_2O_2$) and one of carboxylic acid, carboxylate salt, and acetyl group ($CH_3CO^-$);*
    *forming a gate insulation layer on the substrate to cover the gate electrode and the gate line;*
    *sequentially forming an active layer and an ohmic contact layer on the gate insulation layer;*
    *forming second metal layers including the at least two different metal layers on the substrate;*
    *etching the second metal layers to form a source electrode and a drain electrode;*
    *forming a protective layer to cover the source electrode and the drain electrode on the gate insulation layer with a contact hole for exposing the drain electrode; and*
    *forming a pixel electrode connected to the drain electrode through the contact hole*
    wherein the first metal layers or the second metal layers include at least copper/titanium (Cu/Ti).

13. [The method according to claim 1] *A method of fabricating a thin film transistor, comprising:*
    *forming first metal layers including at least two different metal layers on a substrate;*
    *forming a gate electrode and a gate line by etching with an etchant comprising hydrogen peroxide ($H_2O_2$) and one of carboxylic acid, carboxylate salt, and acetyl group ($CH_3CO^-$);*
    *forming a gate insulation layer on the substrate to cover the gate electrode and the gate line;*
    *sequentially forming an active layer and an ohmic contact layer on the gate insulation layer;*
    *forming second metal layers including the at least two different metal layers on the substrate;*
    *etching the second metal layers to form a source electrode and a drain electrode;*
    *forming a protective layer to cover the source electrode and the drain electrode on the gate insulation layer with a contact hole for exposing the drain electrode; and*
    *forming a pixel electrode connected to the drain electrode through the contact hole,*
    wherein the etchant further comprises fluorine (F).

18. The method according to claim 17, wherein the organic insulation material includes one of an acrylic compound, [benzocylcobytene] *benzocyclobutene* (BCB), and perfluorocyclobutane (PFCB).

19. *The method according to claim 1, wherein the first metal layers or the second metal layers include at least copper/titanium (Cu/Ti).*

20. *The method according to claim 1 wherein the etchant comprises hydrogen peroxide ($H_2O_2$) and one of acetic acid ($CH_3COOH$), citric acid ($C_6H_8O_7$), oxalic acid ($C_2H_2O_4$), and tartaric acid ($C_4H_6O_6$).*

21. *The method according to claim 1 wherein the etchant comprises hydrogen peroxide ($H_2O_2$) and one of ammonium acetate ($CH_3COONH_4$), sodium acetate ($CH_3COONa$), and potassium acetate ($CH_3COOK$).*

22. *The method according to claim 1 wherein the etchant comprises hydrogen peroxide ($H_2O_2$) and one of pivalic acid (($CH_3)_3C_2OOH$), ammonium pivalate (($CH_3)_3C_2OONH_4$), sodium pivalate (($CH_3)_3C_2OONa$), and potassium pivalate (($CH_3)_3C_2OOK$).*

23. *The method according to claim 13 wherein the etchant comprises hydrogen peroxide ($H_2O_2$), one of sodium acetate ($CH_3COONa$) and acetyl group ($CH_3CO$—),*
    *wherein the fluorine (F) has a concentration of about 0.1% or more,*
    *wherein the sodium acetate has a concentration of about 0.5% or more, and the hydrogen peroxide has concentration of about 0.1 mol or more, and*
    *wherein the acetyl group ($CH_3CO$—) includes one of one of pivalic acid (($CH_3)_3C_2OOH$), ammonium pivalate (($CH_3)_3C_2OONH_4$), sodium pivalate (($CH_3)_3C_2OONa$), and potassium pivalate (($CH_3)_3C_2OOK$).*

24. *The method according to claim 1 wherein the etchant consists essentially of hydrogen peroxide ($H_2O_2$), fluorine (F). and at least one of carboxylic acid, carboxylate salt, and acetyl group ($CH_3CO$—).*

25. *A method of fabricating a thin film transistor, comprising:*
    *forming first metal layers including at least two different metal layers on a substrate;*
    *simultaneously etching the first metal layers to form a gate electrode and a gate line with an etchant comprising* hydrogen peroxide ($H_2O_2$), fluorine (F), and one of carboxylic acid, carboxylate salt, and acetyl group ($CH_3CO^-$);

forming a gate insulation layer on the substrate to cover the gate electrode and the gate line;

sequentially forming an active layer and an ohmic contact layer on the gate insulation layer;

forming second metal layers including the at least two different metal layers on the substrate;

simultaneously etching the second metal layers to form a source electrode and a drain electrode with an etchant comprising hydrogen peroxide ($H_2O_2$), fluorine (F), and one of carboxylic acid, carboxylate salt, and acetyl group ($CH_3CO^-$);

forming a protective layer to cover the source electrode and the drain electrode on the gate insulation layer with a contact hole for exposing the drain electrode; and forming a pixel electrode connected to the drain electrode through the contact hole.

26. The method according to claim 25 wherein the etchant consists essentially of hydrogen peroxide ($H_2O_2$), fluorine (F), and at least one of carboxylic acid. carboxylate salt, and acetyl group ($CH_3CO$—).

27. The method according to claim 25, wherein the first metal layers or the second metal layers include at least copper/titanium (Cu/Ti).

28. A method of fabricating a thin film transistor, consisting essentially of:

forming first metal layers including at least two different metal layers on a substrate;

simultaneously etching the first metal layers to form a gate electrode and a gate line with an etchant comprising hydrogen peroxide ($H_2O_2$), fluorine (F), and one of carboxylic acid, carboxylate salt, and acetyl group ($CH_3CO^-$);

forming a gate insulation layer on the substrate to cover the gate electrode and the gate line;

sequentially forming an active layer and an ohmic contact layer on the gate insulation layer;

forming second metal layers including the at least two different metal layers on the substrate;

simultaneously etching the second metal layers to form a source electrode and a drain electrode with an etchant comprising hydrogen peroxide ($H_2O_2$), fluorine (F), and one of carboxylic acid, carboxylate salt, and acetyl group ($CH_3CO^-$);

forming a protective layer to cover the source electrode and the drain electrode on the gate insulation layer with a contact hole for exposing the drain electrode; and forming a pixel electrode connected to the drain electrode through the contact hole.

29. The method according to claim 28 wherein the etchant consists essentially of hydrogen peroxide ($H_2O_2$), fluorine (F), and at least one of carboxylic acid, carboxylate salt, and acetyl group ($CH_3CO$—).

30. The method according to claim 28, wherein the first metal layers or the second metal layers include at least copper/titanium (Cu/Ti).

* * * * *